United States Patent
Oike et al.

(10) Patent No.: US 11,288,057 B2
(45) Date of Patent: Mar. 29, 2022

(54) DEVICE FOR MANAGING SUBSTRATE PROCESSING MACHINE

(71) Applicant: FUJI CORPORATION, Chiryu (JP)

(72) Inventors: Hiroshi Oike, Chiryu (JP); Kenji Sugiyama, Anjo (JP); Yuki Inaura, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/042,710

(22) PCT Filed: Mar. 29, 2018

(86) PCT No.: PCT/JP2018/013315
§ 371 (c)(1),
(2) Date: Sep. 28, 2020

(87) PCT Pub. No.: WO2019/186917
PCT Pub. Date: Oct. 3, 2019

(65) Prior Publication Data
US 2021/0055923 A1 Feb. 25, 2021

(51) Int. Cl.
*G06F 9/445* (2018.01)
*G06F 8/65* (2018.01)
*H05K 13/04* (2006.01)

(52) U.S. Cl.
CPC .......... *G06F 8/65* (2013.01); *H05K 13/0404* (2013.01)

(58) Field of Classification Search
CPC .............................. G06F 8/65; H05K 13/0404
USPC .................................................. 717/168–173
See application file for complete search history.

(56) References Cited

U.S. PATENT DOCUMENTS

2010/0042675 A1* 2/2010 Fujii ................... G06F 11/2046
709/203

FOREIGN PATENT DOCUMENTS

| JP | 11-163600 A | 6/1999 |
| JP | 2008-205075 A | 9/2008 |
| JP | 2010-182768 A | 8/2010 |
| WO | WO 2015/121942 A1 | 8/2015 |

* cited by examiner

*Primary Examiner* — Chuck O Kendall
(74) *Attorney, Agent, or Firm* — Oblon, McClelland, Maier & Neustadt, L.L.P.

(57) ABSTRACT

A management device for a board work machine includes a storage device storing version information in which a current version of software executed by a constitutive device of a board work machine in a production process is associated individually with the multiple constitutive devices and a version designation section configured to designate a version of the software which is to be applied to the production process based on a type of the production process and the version information.

20 Claims, 5 Drawing Sheets

[TABLE 1] PRODUCTION PLAN M1

|  | PRODUCT TYPES | PRODUCTION NUMBERS |
|---|---|---|
| No1 | U1 | T1 |
| No2 | U2 | T2 |
| No3 | U3 | T3 |
| No4 | U4 | T4 |
| ⋮ | ⋮ | ⋮ |

[TABLE 2] VERSION INFORMATION M2

| [PRODUCTION LINE] | CONTROL DEVICE (CONSTITUTIVE DEVICE) | |
|---|---|---|
|  | FIRST ACTIVATION REGION | SECOND ACTIVATION REGION |
| L1 | Ver2.1 | Ver4.0 |
| L2 | Ver3.2 | Ver4.0 |
| L3 | Ver3.2 | Ver4.0 |

[TABLE 3] FUNCTION INFORMATION M3

| VERSIONS | BASIC OPERATIONS | OPTIONAL DEVICE APPLICABILITY | DEDICATED OPERATIONS | DRAWBACKS |
|---|---|---|---|---|
| Ver2.0 | △ | − | − | PRESENT |
| Ver2.1 | △ | − | ○ | PRESENT |
| ⋮ | ⋮ | ⋮ | ⋮ | ⋮ |
| Ver3.2 | ○ | ○ | − | − |
| ⋮ | ⋮ | ⋮ | ⋮ | ⋮ |
| Ver4.0 | ◎ | − | − | − |
| ⋮ | ⋮ | ⋮ | ⋮ | ⋮ |

[TABLE 4] APPLICATION INFORMATION M4

| PRODUCT TYPES | MOUNTING PROCESSES | REQUIRED FUNCTIONS |
|---|---|---|
| U1 | P1 | DEDICATED OPERATIONS |
| U2 | P2 | − |
| U3 | P3 | − |
| U4 | P4 | OPTIONAL DEVICE APPLICABILITY |
| ⋮ | ⋮ | ⋮ |

[TABLE 5] VERSION APPLICATION PLAN M5

|  | MOUNTING PROCESSES | DESIGNATED VERSIONS |
|---|---|---|
| No1 | P1 | Ver2.1 |
| No2 | P2 | Ver4.0 |
| No3 | P3 | Ver4.0 |
| No4 | P4 | Ver3.2 |
| ⋮ | ⋮ | ⋮ |

Fig. 4

[TABLE 2-1] VERSION INFORMATION M2

| [PRODUCTION LINE] | CONTROL DEVICE (CONSTITUTIVE DEVICE) | |
|---|---|---|
| | FIRST ACTIVATION REGION | SECOND ACTIVATION REGION |
| L1 | Ver2.0 | Ver4.0 |
| L2 | Ver3.2 | Ver4.0 |
| L3 | Ver3.2 | Ver4.0 |

[TABLE 2-2] VERSION INFORMATION M2

| [PRODUCTION LINE] | CONTROL DEVICE (CONSTITUTIVE DEVICE) | |
|---|---|---|
| | FIRST ACTIVATION REGION | SECOND ACTIVATION REGION |
| L1 | Ver2.1 | Ver4.0 |
| L2 | Ver3.2 | Ver2.1 |
| L3 | Ver3.2 | Ver4.0 |

[TABLE 2-3] VERSION INFORMATION M2

| [PRODUCTION LINE] | CONTROL DEVICE (CONSTITUTIVE DEVICE) | |
|---|---|---|
| | FIRST ACTIVATION REGION | SECOND ACTIVATION REGION |
| L1 | Ver3.2 | Ver4.0 |
| L2 | Ver4.0 | Ver2.1 |
| L3 | Ver3.2 | Ver4.0 |

Fig. 5

DEVICE FOR MANAGING SUBSTRATE PROCESSING MACHINE

TECHNICAL FIELD

The present application relates to a management device for a board work machine.

BACKGROUND ART

A board work machine for use in production of board products includes a component mounter for mounting supplied components on boards. The component mounter is made up of multiple constitutive devices such as a component supply device, a component transfer device, and the like. The constitutive devices executes firmware corresponding to required functions to control various operations including a component supply and the like. Such firmware may need a version upgrading as a result of addition of a new function. Patent Literature 1 discloses a configuration in which a component mounter automatically executes an update processing of firmware based on a version of firmware installed into a constitutive device.

PATENT LITERATURE

Patent Literature 1: JP-A-2010-182768

BRIEF SUMMARY

Technical Problem

Here, when the constitutive device stops operating in order to execute the updating processing of updating the version of the firmware that the constitutive device executes to a new version, the component mounter cannot execute the mounting process of mounting a component. Therefore, there may be a possibility that the production efficiency of the component mounter is reduced due to the execution of the update processing of software, that is, firmware that the constitutive device executes. In addition, versions of software are desired to be managed more appropriately.

An object of the present description is to provide a management device for a board work machine which can achieve an improvement in production efficiency of the board work machine while managing appropriately software that is used by constitutive device for its control.

Solution to Problem

The present description discloses a management device for a board work machine including a storage device storing version information in which a current version of software executed by a constitutive device of a board work machine in a production process is associated individually with the multiple constitutive devices, and a version designation section configured to designate a version of the software which is to be applied to the production process based on a type of the production process and the version information.

Advantageous Effects

With the configuration described above, the version of the software executed by the board work machine at the current point in time is managed. This enables the management device, which is an external device of the board work machine, to manage the version of the software, whereby the manageability of the board work machine is improved. Additionally, the management device designates the version of the software that is applied for the production process based on the version information. This enables the board work machine to control the various types of operations using the designated version of software suitable for the production process. As a result, production efficiency can be improved.

DESCRIPTION OF EMBODIMENTS

1. Outline of Management Device for Board Work Machine

Hereinafter, referring to drawings, an embodiment will be described in which the present disclosure is applied to a management device for a board work machine. The management device manages a version of software that a constitutive device of the board work machine executes. In the present embodiment, a mode will be described in which the management device manages control device 50, which constitutes a managing target, of component mounter 2, which constitutes a board work machine. Component mounter 2 makes up a production line for use in producing board products.

2. Configuration of Production Line L1

Figure 1:
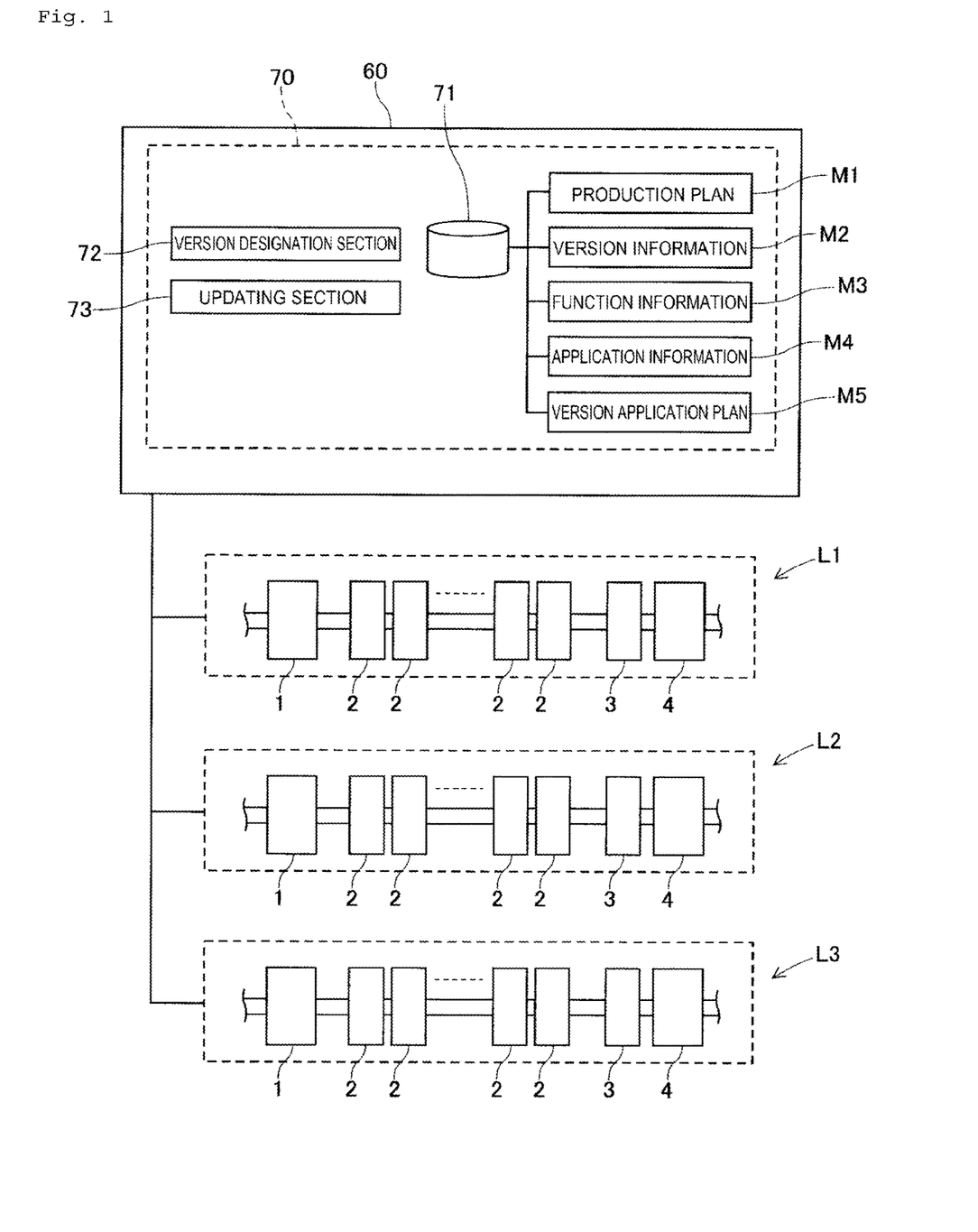
FIG. 1 is a block diagram illustrating a production line and a management device according to an embodiment of the present disclosure.
Figure 2:
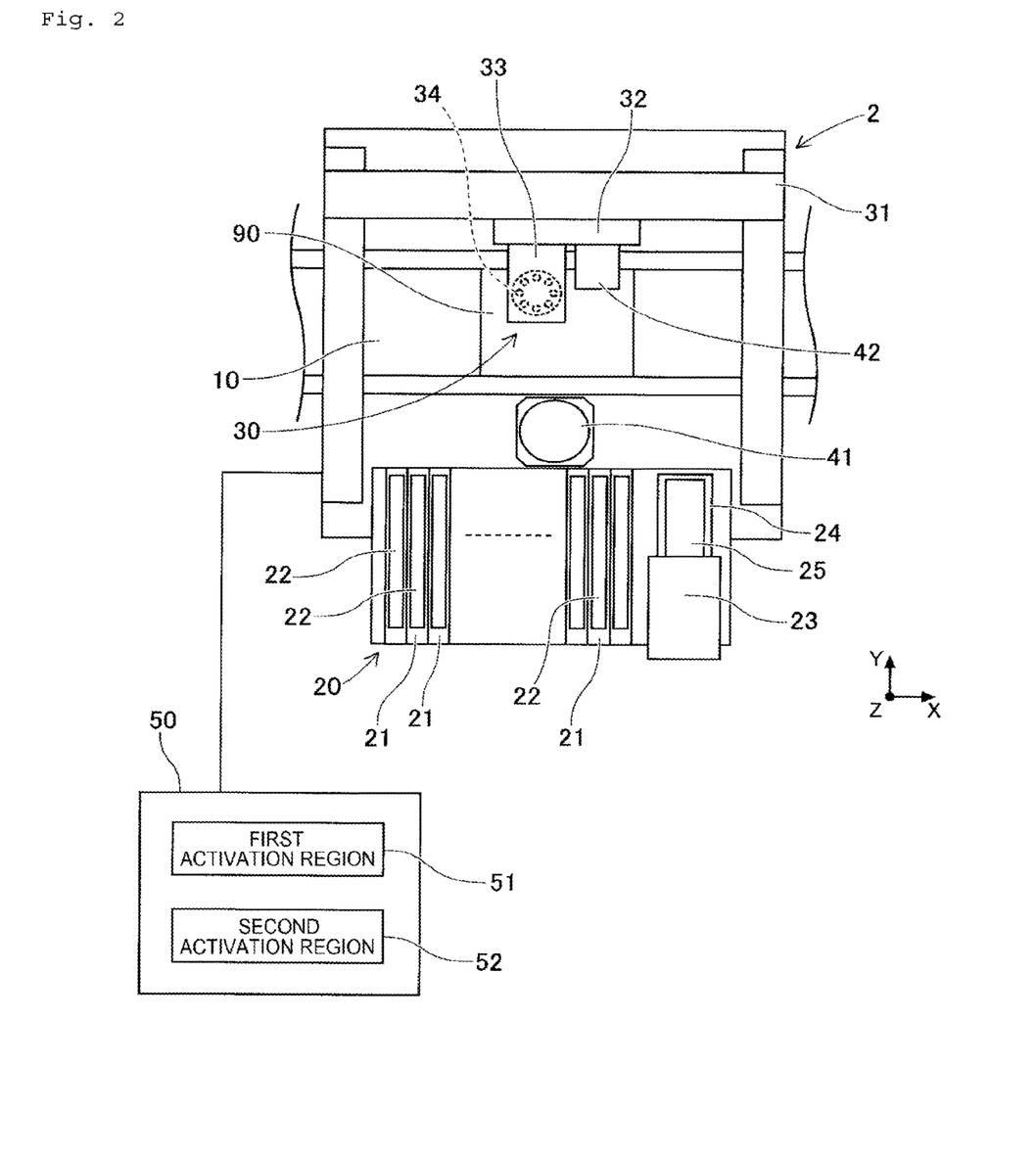
FIG. 2 is a block diagram illustrating the configuration of a component mounter in the production line illustrated in FIG. 1.

As shown in FIG. 1, production line L1 is made up of multiple board work machines which are set in a conveyance direction of board 90 (refer to FIG. 2). Each of the multiple board work machines is connected with host computer 60, which collectively controls production line L1, so as to communicate therewith. Production line L1, which is one of production lines, includes printer 1, multiple component mounters 2, reflow furnace 3, and inspector 4, which make up the multiple board work machines.

Printer 1 prints a paste-state solder in a mounting position of a component on board 90 which is conveyed in or loaded. Each of multiple component mounters 2 mount components on board 90 which is conveyed from an upstream side of production line L1. The configuration of component mounter 2 will be described later on. Reflow furnace 3 heats board 90 conveyed from the upstream side of production line L1 so as to melt the solder on board 90 and executes a required soldering. Inspector 4 inspects whether a board product produced by production line L1 functions properly.

In the present embodiment, three production lines L1-L3 are installed in a board products assembling plant. Second and third production lines L2, L3 have a substantially similar configuration to that of first production line L1 described above, a detailed description of second and third production lines L2, L3 will be omitted herein. Host computer 60 also controls second production line L2 and third production line L3 collectively, in addition to first production line L1.

The configurations of three production lines L1 to L3 can be equipped with additional configurations or can be modified in accordance with, for example, types of boards to be produced. Specifically speaking, a board work machine such as a buffer device for temporarily holding board 90 conveyed, a board supply device, a board flipping device, various types of inspectors, a shield mounting device, an adhesive application device, an ultraviolet ray irradiation device, or the like can be set in three production lines L1 to L3 as required.

3. Configuration of Component Mounter 2

Component mounter 2 executes a mounting process of mounting a component on board 90. As shown in FIG. 2, component mounter 2 includes board conveyance device 10, component supply device 20, component transfer device 30, part camera 41, board camera 42, and control device 50. Board conveyance device 10 is made up of a belt conveyor and a positioning device. Board conveyance device 10 sequentially conveys board 90 in a conveyance direction and positions board 90 in a predetermined position within component mounter 2. Board conveyance device 10 conveys out board 90 to an outside of component mounter 2 after the mounting process is ended.

Component supply device 20 supplies a component that is to be mounted on board 90. Component supply device 20 includes feeders 22 that are set in multiple slots 21. Feeder 22 feeds and moves a carrier tape in which a number of components are accommodated to supply components so as to be picked up. Additionally, component supply device 20 supplies, for example, relatively large components in such a state as to be arranged neatly on tray 25 placed in pallet 24. Storage device 23 of component supply device 20 accommodates multiple pallets 24 and pulls out a predetermined pallet 24 in accordance with a mounting process so as to supply components thereon.

Component transfer device 30 transfers the component supplied by component supply device 20 to a predetermined mounting position on board 90 which is conveyed into an interior of component mounter 2 by board conveyance device 10. Head driving device 31 of component transfer device 30 moves moving table 32 in a horizontal direction (an X-axis direction and a Y-axis direction) using a linear motion mechanism. Mounting head 33 is fixed to moving table 32 with a clamping member, now shown, in such a manner as to be exchanged. Mounting head 33 supports multiple suction nozzles 34 rotatably and in such a manner as to be raised and lowered. Suction nozzle 34 picks up a component supplied by feeder 22 using a negative pressure air.

Part camera 41 and board camera 42 are a digital imaging device having an imaging element such as a CMOS. Part camera 41 and board camera 42 execute imaging based on a control signal and transmit image data acquired through the imaging. Part camera 41 is configured to image a component held by suction nozzle 34 of mounting head 33 from below. Board camera 42 is configured to image board 90 from above.

Control device 50 is made up mainly of CPU, various types of memories, and a control circuit. Control device 50 controls a mounting process of mounting a component on board 90. The mounting process is a type of a production process and includes a process of repeating multiple times a pick-and-place cycle (hereinafter, also, referred to as a "PP cycle") in which a component supplied by component supply device 20 is picked up and is then mounted in the predetermined position on board 90. In the mounting process, control device 50 controls the operation of component transfer device 30 based on information outputted from various sensors, the results of image processing, or a control program stored in advance. As a result, positions and angles of multiple suction nozzles 34 supported on mounting head 33 are controlled.

In component mounter 2 configured as described above, board conveyance device 10, feeders 22, accommodation device 23, head driving device 31, mounting head 33, part camera 41, board camera 42, and control device 50 are constitutive devices which make up component mounter 2. These constitutive devices execute software corresponding to required functions (for example, a function of feeder 22 of supplying a component, and a function of control device 50 of controlling the operation of component transfer device 30). In the present embodiment, the software is firmware installed into the constitutive devices.

In the present embodiment, control device 50 is configured to install in advance multiple versions of software which differ from each other. More specifically speaking, there are secured in control device 50 first activation region 51 and second activation region 52 which can execute selectively the same types of software installed therein. For example, versions (Ver 2.1, Ver 4.0), which differ from each other, are installed in first activation region 51 and second activation region, as shown in Table 2 in FIG. 3, of control device 50 of each of multiple component mounters 2 making up first production line L1.

Control device 50 is notified of a designated version of software that control device 50 is to execute by management device 70, which will be described later on, and activates software corresponding to the designated version. In the present embodiment, as shown in Table 2 in FIG. 3, management device 70 manages versions of software that are individually installed in multiple production lines L1 to L3. That is, the multiple versions of software installed in individual control devices 50 of multiple component mounters 2 which make up first production line L1 are common. However, the versions of software may be managed in each of multiple control devices 50 in same production line L1.

4. Overview of Host Computer 60 and Configuration of Management Device 70

Host computer 60 monitors operating statuses of production lines L1 to L3 and controls board work machines such as component mounters 2. Host computer 60 functions as management device 70 for the board work machines with constitutive device and installed software. In the present embodiment, management device 70 manages control device 50, as a managing target, which is one of the constitutive devices of component mounter 2 and manages specifically versions of software programmed into control device 50.

As shown in FIG. 1, management device 70 includes storage device 71, version designation section 72, and updating section 73. Storage device 71 is made up of an optical drive device such as a hard disk device or a flash memory. This storage device 71 stores various types of data such as control programs for use in controlling the board work machines. Storage device 71 stores in advance production plan M1, version information M3, function information M4, and version application plan M5. As shown in Table 1 in FIG. 3, production plan M1 described above indicates target production numbers (T1, T2, T3, . . . ) for production types (U1, U2, U3, . . . ) of board products in multiple production lines L1 to L3.

Version information M2 is information in which the current version of software executed by the constitutive device of the board work machine in a production process (a mounting process) is associated with the multiple constitutive devices. More specifically speaking, in the present embodiment, version information M2 indicates the current version of software executed by control device 50 of component mounter 2 in the mounting process (for example, firmware for controlling the operation of component transfer device 30) in association with control devices 50 of each of multiple production lines L1 to L3.

Here, in the present embodiment, control device 50 can install versions of software which differ from each other. Then, version information M2 stores, of two types of versions installed, a version that is executed last as the current version (thick frame sections in Table 2 in FIG. 3). Specifically speaking, according to Table 2 in FIG. 3, the current version executed last by multiple control devices 50 in first production line L1 Ver 4.0 that is installed in second activation region 52.

Figure 3:
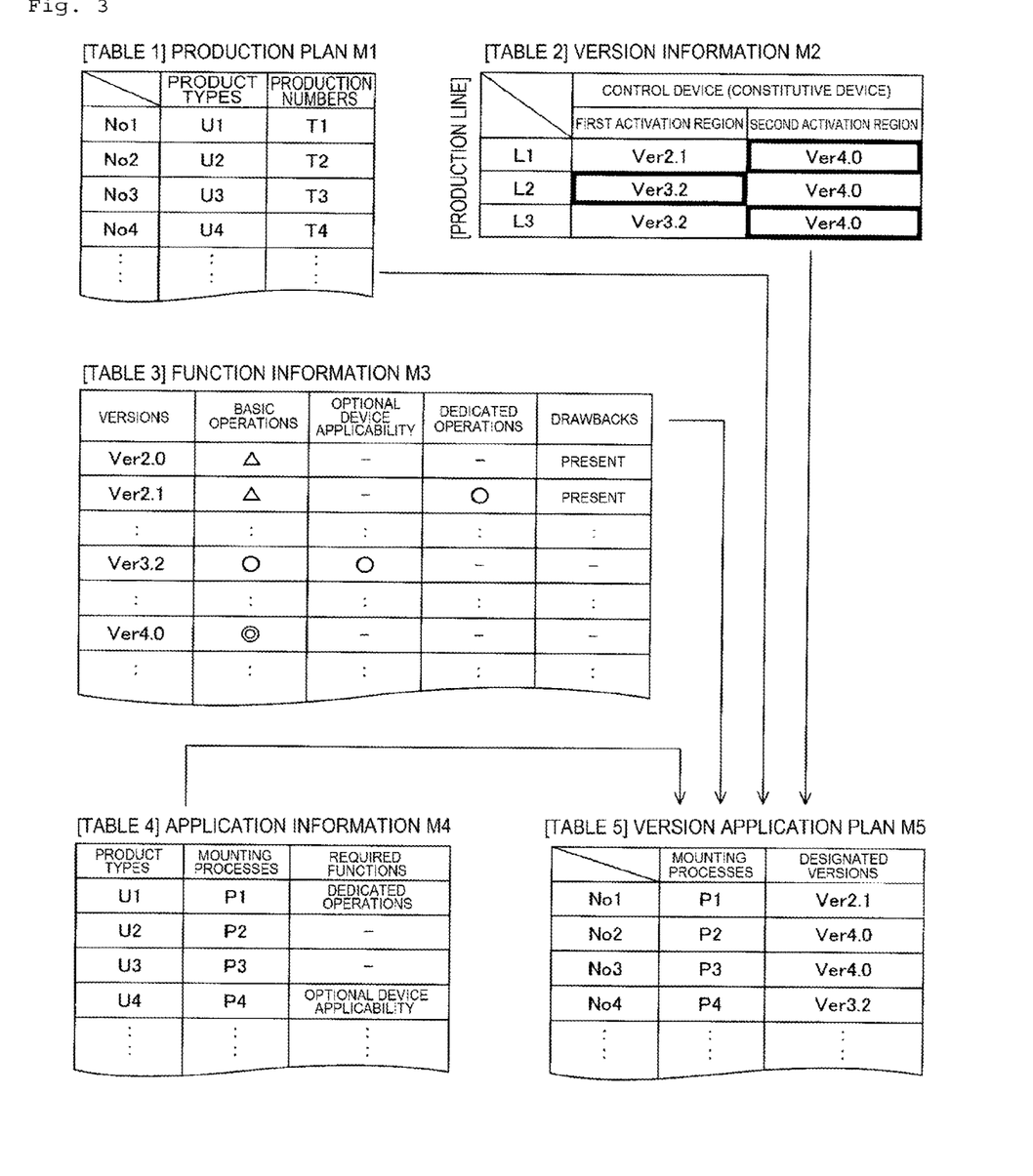
FIG. 3 is a diagram illustrating various types of data including version information.

As shown in Table 3 in FIG. 3, function information M3 is information in which functions of software are associated with multiple versions. Specifically speaking, in function information M3, items such as a basic operation (for example, the operation of component transfer device 30 in the mounting process), which is a main function, whether a version is applicable to an optional device, a dedicated operation corresponding to a special mounting process, whether there exists a drawback recognized, and the like are linked with each version. For example, according to Table 3 in FIG. 3, Ver 2.1 is not applicable to optional device but copes with a dedicated operation. Ver 4.0 is recorded as not applicable to optional device and a dedicated operation but executing a good basic operation by improving software or the like.

Application information M4 is information in which functions of software required in production processes (mounting processes) are associated individually with types of production processes. Specifically speaking, in application information M4, as shown in Table 4 in FIG. 3, types (P1, P2, P3, . . . ) of mounting processes which are executed to produce product types (U1, U2, U3, . . . ) are associated individually with functions of software required in the mounting processes. For example, according to Table 4 of FIG. 3, a mounting process (P4) which is executed to produce a product type (U4) is required to have a function applicable to optional device.

Version application plan M5 indicates versions which are to be applied individually to mounting processes scheduled to be executed. Version application plan M5 is generated by version designation section 72, which will be described later on in a management process of software. The management process of software and version application plan M5 will be described in detail later on.

Version designation section 72 designates a version of software applied to a production process (a mounting process) based on a type of the production process and version information M2. In the present embodiment, version designation section 72 designates a version of software which is applied to a mounting process based on production plan M1, function information M3, and application information M4, which record types of mounting processes scheduled to be executed. Here, in the present embodiment, software, whose versions are different from each other, is installed in advance individually in first activation region 51 and second activation region 52 of control device 50.

Then, when designating a version of software that control device 50 executes, version designation section 72 designates a version of software applied to a mounting process to be executed by selecting one of the multiple versions of software installed in control device 50 based on a type of the mounting process. As a result, management device 70 can allow the version of software suitable for the mounting process to be executed without involving a new install operation.

When multiple versions of software are installed in a constitutive device of component mounter 2, updating section 73 updates any one of the multiple versions of software. In the present embodiment, when control device 50 is executing one or a first version of software of the multiple versions of software based on production plan M1, updating section 73 updates a second version of software. For example, when a version of software suitable for a mounting process scheduled to be executed is not installed in control device 50, updating section 73 updates software at rest before the mounting process in question is executed. This allows a designated version of software to be installed before the scheduled mounting process is executed.

Additionally, updating section 73 can set a version of software suitable for a mounting process by recognizing a mounting process scheduled to be executed based on production plan M1. Further, the updating section can set a timing when the software is updated based on production plan M1. As a result, a reduction in production efficiency associated with the installation of software can be prevented.

Here, the mounting process executed by component mounter 2 includes the process of repeating the PP cycle as described above. Then, in the present embodiment, updating section 73 updates the software during a low load period in a mounting process when a processing load of control device 50 is reduced more than while control device 50 is executing the PP cycle. Here, a software updating process takes a predetermined period of time, and a predetermined load is exerted on a control device of target control device 50. As a result, when an updating process of software is executed, there may be a possibility that the operation of control device 50 is badly affected depending upon an updating execution timing in the mounting process. Then, the operation of control device 50 can be prevented from being affected badly in the mounting process by executing the updating process during the low load period as described above.

5. Management Processing by Management Device 70

A software management processing executed by management device 70 will be described by reference to FIGS. 3 to 5. Here, a managing target of management device 70 is control device 50 making up component mounter 2, which constitutes a board work machine. Control device 50 has installed therein software for controlling the operation of component transfer device 30 in a mounting process. More specifically speaking, as shown in Table 2-1 in FIG. 4, software of Ver2.0 is installed in first activation region 51, and software of Ver4.0 is installed in second activation region 52 of control device 50.

Figure 4:
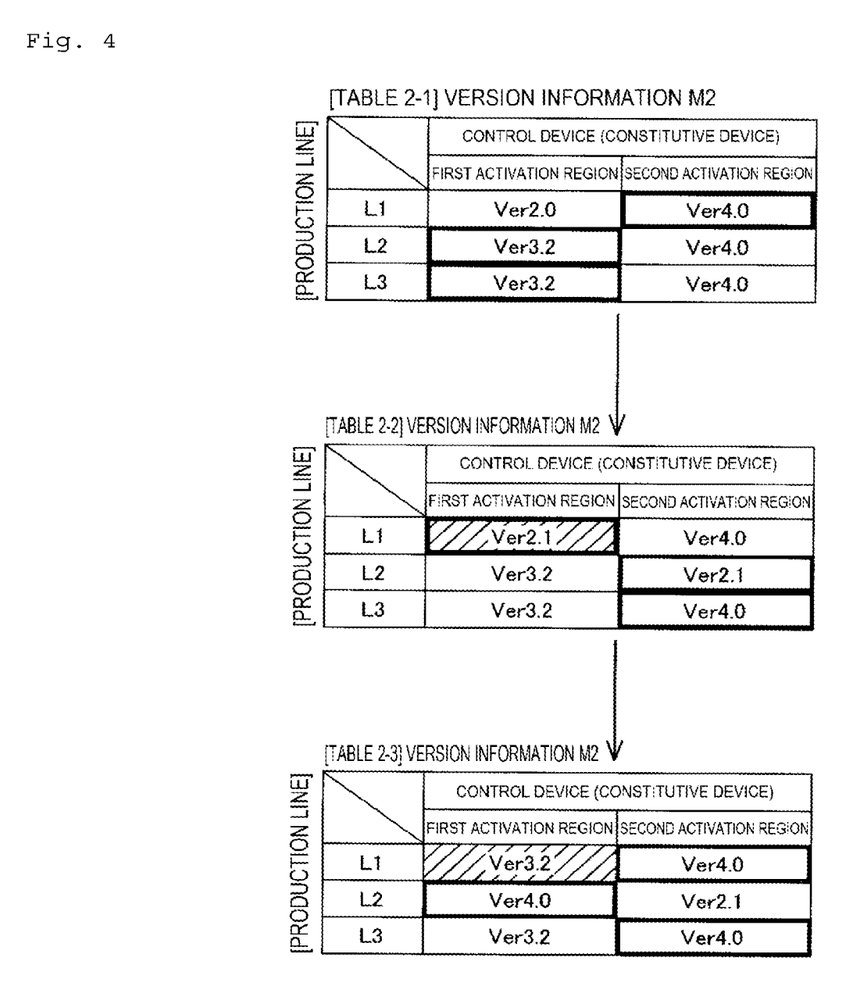
FIG. 4 is a drawing illustrating version information of software stored in a constitutive device in a production process.
Figure 5:
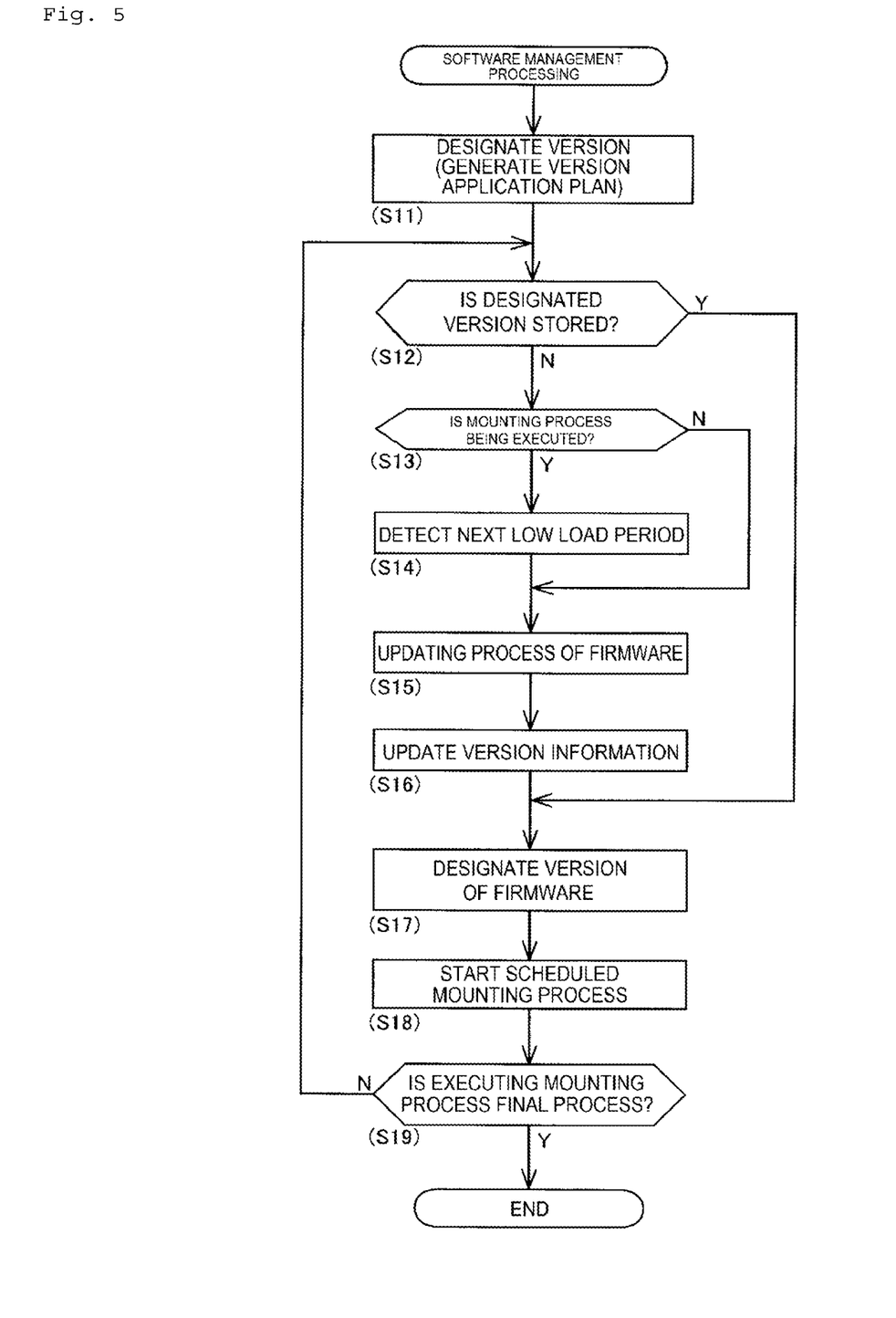
FIG. 5 is a flowchart illustrating a management process of software in a production process.

Version information M2 shown in FIG. 4 is stored in storage device 71 of management device 70. In addition, thick frame sections in Table 2-1 in FIG. 4 indicate versions of software that control device 50 executes last in mounting processes. Hereinafter, multiple mounting processes indicated in production plan M1 shown in Table 1 in FIG. 3 are scheduled to be executed. Version designation section 72 of management device 70 firstly designates versions of software that are applied individually to the multiple mounting processes (S11).

To describe this in detail, version designation section 72 designates versions that are applied individually to the mounting processes based on production plan M1, function information M3, and application information M4, which record types of the mounting processes, and prepares version application plan M5 as shown in Table 5 in FIG. 3. Specifically speaking, according to application information M4, since first mounting process (P1) is a process of producing product type (U1) and a dedicated operation is necessary, a version is designated so that Ver2.1 is applied to first mounting process (P1) based on function information M3.

Next, updating section 73 determines whether a version of software suitable for the next mounting process is stored in control device 50 (S12). For example, if a designated version of software executed in a next mounting process (P1) is Ver2.1 and the designated version of software is not stored in current control device 50 (S12: No), updating section 73 determines whether a mounting process is being executed (S13). If control device 50 is executing the mounting process (S13: Yes), updating section 73 detects a next low load period in the mounting process (S14).

Here, the low load period includes, for example, an execution period of a board conveyance process or a maintenance process. A board conveyance process is a process of conveying out or unloading a board on which components are mounted completely after a series of PP cycles are executed in a mounting process and conveying in or loading a new board. A maintenance process is a process of executing measurements to see whether a mechanical error is generated to thereby execute a calibration as required in order to maintain a proper operation of a constitutive device when the number of times of execution of the PP cycles reaches a defined count number or an operation time of a predetermined constitutive device reaches a defined time.

The board conveyance process and the maintenance process are a process not involving an operation of mounting head 33 or a process which is easier and simpler than an operation performed in the PP cycles even when the process involves an operation of mounting head 33, and a processing load in various constitutive devices such as control device 50 is small. Updating section 73 estimates, for example, a degree of progress in the current mounting process based on a control program and detects a low load period which is long enough to secure a sufficient time to update the software currently and afterwards. The low load period may be a single continuous period or a period made up of multiple periods.

If the low load period detected in S14 results or control device 50 has not currently started the mounting process yet (S13: No), updating section 73 executes an updating process of the software (S15). In the updating process of the software, management device 70 transmits a designated version of software by communicating with control device 50 of component mounter 2. Control device 50 causes the software so inputted to be stored in a predetermined activation region.

Here, as an activation region where to store the new software, if control device 50 is executing the mounting process (S13: Yes), a different activation region is designated which differs from the activation region which is used in the mounting process and hence stores the software which is being executed in the mounting process in question. Additionally, as an activation region where to store the new software, if control device 50 is not executing the mounting process (S13: No), an activation region is designated which differs from the activation region where a version of software is stored which is to be used first in a mounting process from a next time onwards.

Updating section 73 designates first activation region 51 or second activation region 52 of control device 50 based on version application plan M5 and causes new software to be stored in the designated activation region. As a result, the software of, for example, first activation region 51 is updated from Ver2.0 to Ver2.1. Updating section 73 updates version information M2 as indicated by a shaded section in Table 2-2 in FIG. 4 after the updating process of the software is finished (S16).

Thereafter, version designation section 72 designates a version of software to be used in a scheduled mounting process before the mounting process is started to be executed (S17). Specifically speaking, version designation section 72 designates a version of software for use in the mounting process by selecting one of the multiple versions (Ver2.1, Ver4.0) stored in control device 50. As a result, if the scheduled mounting process is started (S18), control device 50 executes the software stored in, for example, first activation region 51.

Management device 70 determines based on the production plan whether the mounting process which is being executed is a last process (S19). If the mounting process which is being executed is not a last process, (S19: No), management device 70 repeats the processing operations in S12 to S18. Here, for example, according to Table 5 in FIG. 3, the version (Ver4.0) of software which is to be applied or used in second mounting process (P2) and third mounting process (P3) has already been stored in second activation region 52 of control device 50. On the other hand, a version (Ver3.2) of software which is to be used in fourth mounting process (P4) has been stored in neither of the activation regions.

Then, by executing the processing operations (S12 to S18) described above, updating section 73 updates the software in first activation region 51 to the version (Ver3.2) of software which is scheduled to be used during execution of second mounting process (P2) or during execution of third mounting process (P3) (S15). Further, updating section 73 updates version information M2 as indicated by a shaded section in Table 2-3 in FIG. 4 after the updating process of the software is finished (S16). If the mounting process which is being executed is a final process (S19: Yes), management device 70 ends the management processing of the software.

6. Effects Provided by Configuration of Embodiment

Management device 70 for a board work machine (component mounter 2) described above includes storage device 71 which stores version information M2 in which the current version of software (firmware) executed by control device 50 of component mounter 2 in the production process (the mounting process) is associated individually with multiple control devices 50 and version designation section 72 which designates a version of software to be applied or used in the production process based on the type of the production process and version information M2.

With this configuration, the version of software is managed which is executed by control device 50 at this current point in time. As a result, management device 70, which is an external device of component mounter 2, can manage versions of software, whereby the manageability of component mounter 2 is improved. In addition, management device 70 designates a version of software which is to be used for a mounting process based on version information M2. As a result, component mounter 2 can control various operations using designated versions of software suitable for a mounting process. As a result, production efficiency can be improved.

7. Variation of Embodiment

7-1. Execution of Software

In the embodiment, the software executed by control device 50, which is a constitutive device, is described as being firmware installed into control device 50. On the other hand, the software may be software stored in advance in, for example, a predetermined activation region of storage device 71 of management device 70. Then, control device 50 communicates with management device 70, which is the external device, via the network and executes the software stored in the predetermined activation region.

In this configuration, version designation section 72 designates a version of software for use in a mounting process based on a type of the mounting process by storing in advance predetermined versions of software in the activation regions. Additionally, in the event that a version of software to be used is not stored in the predetermined activation region, for example, updating section 73 can cope with this event by updating the software as required.

With this configuration, control device 50 of component mounter 2 executes the software stored in the predetermined activation region of storage device 71 of management device 70 via the network. As a result, a version of software to be used in the mounting process can be designated by setting a version of software to be stored in the activation region as required. Thus, there can be omitted an operation of installing in advance software in control device 50 as a setup operation for a mounting process scheduled to be executed. As a result, the production efficiency can be improved.

In the embodiment described above, a configuration may be adopted in which multiple versions of software which differ from each other are stored in advance in multiple activation regions in storage device 71. This configuration is similar to the configuration of the embodiment in which the versions of software which differ from each other are stored in advance in first activation region 51 and second activation region 52 of control device 50, which is the constitutive device, and therefore, a detailed description of the configuration will be omitted here. Main differences between these configurations are in that the storage devices for storing the software differ, and in that whether control device 50, which is the constitutive device, executes the software via the network.

Because of this, version designation section 72 designates a version of software which is to be applied or used for a mounting process based on a type of the mounting process by causing control device 50 to activate the software stored in one of the multiple activation regions thereof. With this configuration, when control device 50 executes the software stored in the activation region via the network, one of the multiple activation regions of control device 50 is designated by version designation section 72.

As a result, version designation section 72 can switch the versions of software that control device 50 executes by setting the activation region accordingly. As a result, software suitable for a mounting process which is scheduled to be executed can be stored in a predetermined activation region in advance, whereby versions can individually designated for multiple control devices 50. In the case that an activation region where to store software that is to be executed by control device 50 is fixed, version designation section 72 may substantially designate a version by causing updating section 73 to update the software stored in the activation region in question in advance.

7-2. Designation of Version

In the embodiment, version designation section 72 is described as designating a version of software to be applied or used for a mounting process based on production plan M1, function information M3, and application information M4. On the other hand, version designation section 72 may set a version that it designates using various methods. For example, version designation section 72 may recognize the current version based on version information M2 to designate a latest version or may designate a version set by the operator or managing person.

In the embodiment and the modification thereof, control device 50 or storage device 71 of management device 70 is described as being configured to cause the two versions, differing from each other, of software to be stored. On the other hand, a configuration may be adopted in which three or more versions of software are stored in advance in control device 50 or management device 70, and version designation section 72 designates one of the three or more versions. With this configuration, a more precise version switching can be effected without involving any updating process.

7-3. Management Device

In the embodiment, management device 70 is described as being incorporated in host computer 60. On the other hand, management device 70 can adopt other various forms in addition to host computer 60, as long as management device 70 constitutes an external device of component mounter 2, which is a board work machine. For example, management device 70 may be a management dedicated device set in an assembly plant for board products or a server connected with a board work machine for communication via Internet. With any one of the configurations described above, the same working effect as that of the embodiment can be provided.

7-4. Others

In the embodiment, the constitutive device into which the software is programmed is described as being control device 50 of component mounter 2. In contract with this, the constitutive device may be, for example, board conveyance device 10, mounting head 33, or the like in addition to control device 50, provided that the constitutive device makes up component mounter 2. Further, in the embodiment, component mounter 2, which is a board work machine, constitutes a managing target of management device 70. In contrast with this, other board work machines than component mounter 2 (the printer, the inspector, the shield mounting device, and the like) may constitute a managing target of management device 70.

In addition, management device 70 is described as designating a common version for multiple production lines L1 to L3, provided production lines L1 to L3 are the same production line in terms of configuration. In contrast with this, in addition to managing the individual production lines as described above, management device 70 may manage individually multiple board work machines so as to permit them to have different versions. Further, a configuration may be adopted in which management device 70 executes a simultaneous management of the individual production lines and an individual management of board work machines in a complex fashion and switches the management between the simultaneous management and the individual management as required. As a result, the manageability of the board work machine can be improved.

REFERENCE SIGNS LIST

2: Component mounter (Board work machine); 50: Control device (constitutive device); 51: First activation region; 52: Second activation region; 70: Management device; 71: Storage device; 72: Version designation section; 73: Updating section; 90: Board; M1: Production plan; M2: Version information; M3: Function information; M4: Application information; M5: Version application plan

The invention claimed is:

1. A management device comprising:
   a storage device storing version information in which a current version of software executed by a respective constitutive device of a board work machine in a production process performed by the board work machine as a part of a production plan to produce board products is associated individually with multiple constitutive devices, the board products having at least one component mounted thereon by virtue of the production plan; and
   circuitry configured to:
      designate a version of the software which is to be applied to a next production process performed by the board work machine as a part of the production plan based on a type of the next production process performed by the board work machine as the part of the production plan and the version information;
      determine whether or not the version of the software which is to be applied to the next production process is stored in the respective constitutive device; and
      install the version of the software which is to be applied to the next production process into the respective constitutive device while the respective constitutive device is executing another version of the software that is different from the version of the software which is to be applied to the next production process when the version of the software which is to be applied to the next production process is determined to not be stored in the respective constitutive device.

2. The management device according to claim 1, wherein the storage device further stores:
   function information in which a function of the software is associated individually with multiple versions of the software; and
   application information in which functions of the software which are required in the production process are associated individually with types of the production process, and
   the circuitry is configured to designate the version of the software which is to be applied to the next production process based on the production plan in which the types of the production process scheduled to be executed are recorded, the function information, and the application information.

3. The management device according to claim 1, wherein multiple versions of the software, which differ from each other, are installed in advance in the respective constitutive device, and
   the circuitry is configured to designate the version of the software which is to be applied to the next production process by selecting one of the multiple versions of the software installed in the respective constitutive device based on a type of the next production process.

4. The management device according to claim 1, wherein multiple versions of the software, which differ from each other, are installed in advance in the respective constitutive device, and
   the circuitry is configured to update one of the multiple versions of the software by installing the version of the software which is to be applied to the next production process into the respective constitutive device.

5. The management device according to claim 4, wherein the circuitry is configured to designate the version of the software which is to be applied to the next production process based on the production plan in which types of the production process that are scheduled to be executed are recorded.

6. The management device according to claim 4, wherein the board work machine is a component mounter executing a mounting process including a process of repeating a pick-and-place cycle in which a component supplied is picked up and the component so picked up is mounted on a board as the production process, and
   the circuitry is configured to update the one of the multiple versions of the software during a low load period in the mounting process when a processing load of the respective constitutive device is reduced more than while the pick-and-place cycle is being executed.

7. The management device according to claim 1, wherein the respective constitutive device executes the software that has been stored in advance in a predetermined activation region of the storage device, and
   the circuitry is configured to designate the version of the software which is to be applied to the next production process based on a type of the next production process by storing in advance the version of the software which is to be applied to the next production process in the predetermined activation region.

8. The management device according to claim 7, wherein multiple versions of the software, which differ from each other, are respectively stored in advance in multiple activation regions of the predetermined activation region of the storage device, and
   the circuitry is configured to designate the version of the software which is to be applied to the next production process based on the type of the production process by causing the respective constitutive device to activate the version of the software which is to be applied to the next production process stored in one of the multiple activation regions.

9. The management device according to claim 1, wherein multiple versions of the software, which differ from each other, are respectively stored in multiple activation regions of the respective constitutive device, and
   the circuitry is configured to install the version of the software which is to be applied to the next production process into a first of the multiple activation regions of the respective constitutive device while the respective constitutive device is executing the other version of the software, which is stored in a second of the multiple activation regions of the respective constitutive device, when the version of the software which is to be applied to the next production process is determined to not be stored in the multiple activation regions of the respective constitutive device.

10. A system comprising:
a board work machine including a constitutive device configured to execute software that causes the board work machine to perform a production process as a part of a production plan to produce board products having at least one component mounted thereon by virtue of the production plan; and
a management device including:
  a storage device storing version information in which a current version of the software executed by the constitutive device is associated with the constitutive device; and
  circuitry configured to:
    designate a version of the software which is to be applied to a next production process performed by the board work machine as a part of the production plan based on a type of the next production process performed by the board work machine as the part of the production plan and the version information;
    determine whether or not the version of the software which is to be applied to the next production process is stored in the constitutive device; and
    install the version of the software which is to be applied to the next production process into the constitutive device while the constitutive device is executing another version of the software that is different from the version of the software which is to be applied to the next production process when the version of the software which is to be applied to the next production process is determined to not be stored in the constitutive device.

11. The system according to claim 10, wherein
the storage device further stores:
  function information in which a function of the software is associated individually with multiple versions of the software; and
  application information in which functions of the software which are required in the production process are associated individually with types of the production process, and
the circuitry is configured to designate the version of the software which is to be applied to the next production process based on the production plan in which the types of the production process scheduled to be executed are recorded, the function information, and the application information.

12. The system according to claim 10, wherein
multiple versions of the software, which differ from each other, are installed in advance in the constitutive device, and
the circuitry is configured to designate the version of the software which is to be applied to the next production process by selecting one of the multiple versions of the software installed in the constitutive device based on a type of the next production process.

13. The system according to claim 10, wherein
multiple versions of the software, which differ from each other, are installed in advance in the constitutive device, and
the circuitry is configured to update one of the multiple versions of the software by installing the version of the software which is to be applied to the next production process into the constitutive device.

14. The system according to claim 13, wherein the circuitry is configured to designate the version of the software which is to be applied to the next production process based on the production plan in which types of the production process that are scheduled to be executed are recorded.

15. The system according to claim 13, wherein
the board work machine is a component mounter executing a mounting process including a process of repeating a pick-and-place cycle in which a component supplied is picked up and the component so picked up is mounted on a board as the production process, and
the circuitry is configured to update the one of the multiple versions of the software during a low load period in the mounting process when a processing load of the constitutive device is reduced more than while the pick-and-place cycle is being executed.

16. The system according to claim 10, wherein
the constitutive device executes the software that has been stored in advance in a predetermined activation region of the storage device, and
the circuitry is configured to designate the version of the software which is to be applied to the next production process based on a type of the next production process by storing in advance the version of the software which is to be applied to the next production process in the predetermined activation region.

17. The system according to claim 16, wherein
multiple versions of the software, which differ from each other, are respectively stored in advance in multiple activation regions of the predetermined activation region of the storage device, and
the circuitry is configured to designate the version of the software which is to be applied to the next production process based on the type of the production process by causing the constitutive device to activate the version of the software which is to be applied to the next production process stored in one of the multiple activation regions.

18. The system according to claim 10, wherein
multiple versions of the software, which differ from each other, are respectively stored in multiple activation regions of the constitutive device, and
the circuitry is configured to install the version of the software which is to be applied to the next production process into a first of the multiple activation regions of the constitutive device while the constitutive device is executing the other version of the software, which is stored in a second of the multiple activation regions of the constitutive device, when the version of the software which is to be applied to the next production process is determined to not be stored in the multiple activation regions of the constitutive device.

19. A system comprising:
a component mounter including a control device configured to execute software that causes the component mounter to perform a mounting process of repeating a pick-and-place cycle in which a component supplied is picked up and the component so picked up is mounted on a board as a part of a production plan to produce board products; and
a management device including:
  a storage device storing version information in which a current version of the software executed by the control device is associated with the control device; and
  circuitry configured to:
    designate a version of the software which is to be applied to a next mounting process performed by the component mounter based on a type of the next mounting process performed by the component mounter and the version information;

determine whether or not the version of the software which is to be applied to the next mounting process is stored in the control device; and install the version of the software which is to be applied to the next mounting process into the control device while the control device is executing another version of the software that is different from the version of the software which is to be applied to the next mounting process when the version of the software which is to be applied to the next mounting process is determined to not be stored in the control device.

20. The system according to claim 19, wherein multiple versions of the software, which differ from each other, are respectively stored in multiple activation regions of the control device, and the circuitry is configured to install the version of the software which is to be applied to the next mounting process into a first of the multiple activation regions of the control device while the control device is executing the other version of the software, which is stored in a second of the multiple activation regions of the control device, when the version of the software which is to be applied to the next mounting process is determined to not be stored in the multiple activation regions of the control device.

* * * * *